(12) United States Patent
Katoh et al.

(10) Patent No.: US 6,554,180 B1
(45) Date of Patent: Apr. 29, 2003

(54) LEAD-FREE SOLDER PASTE

(75) Inventors: Rikiya Katoh, Sohka (JP); Osamu Munekata, Koshigaya (JP); Yoshitaka Toyoda, Satte (JP)

(73) Assignee: Senju Metal Industry Co., Ltd., Tokyo (JP)

(*) Notice: Subject to any disclaimer, the term of this patent is extended or adjusted under 35 U.S.C. 154(b) by 0 days.

(21) Appl. No.: 09/637,922

(22) Filed: Aug. 14, 2000

(30) Foreign Application Priority Data

Aug. 20, 1999 (JP) .......................................... 11-234345

(51) Int. Cl.[7] .............................................. B23K 35/363
(52) U.S. Cl. ............................ 228/224; 148/24; 148/23
(58) Field of Search ..................... 148/23, 24; 228/224

(56) References Cited

U.S. PATENT DOCUMENTS

| | | | |
|---|---|---|---|
| 4,670,217 A | | 6/1987 | Henson et al. ............... 420/562 |
| 4,929,423 A | * | 5/1990 | Tucker et al. ................ 420/561 |
| 4,988,395 A | * | 1/1991 | Taguchi et al. ................ 148/24 |
| 5,074,928 A | * | 12/1991 | Sanji et al. .................... 148/23 |
| 5,176,759 A | * | 1/1993 | Taguchi ........................ 148/24 |
| 5,455,004 A | * | 10/1995 | Slaatery et al. .............. 420/562 |
| 5,455,122 A | * | 10/1995 | Carey et al. .................. 428/659 |
| 5,538,686 A | * | 7/1996 | Chen et al. ................... 420/557 |
| 5,980,822 A | * | 11/1999 | Moon et al. ................. 420/561 |
| 6,033,488 A | * | 3/2000 | An et al. ....................... 148/24 |
| 6,050,480 A | | 4/2000 | Taguchi et al. ........... 228/248.1 |
| 6,123,248 A | * | 9/2000 | Tadauchi et al. ......... 228/111.5 |
| 6,139,979 A | | 10/2000 | Takaoka et al. ............. 428/646 |
| 6,159,304 A | * | 12/2000 | Noguchi et al. .............. 148/23 |

FOREIGN PATENT DOCUMENTS

| | | |
|---|---|---|
| EP | 251611 | 1/1988 |
| EP | 499452 | 8/1992 |
| EP | 710521 | 5/1996 |
| JP | 9327790 | 12/1997 |
| WO | WO0048784 | 8/2000 |

OTHER PUBLICATIONS

ASM Handbook, vol. 2, formerly 10th ed., pp. 520–521, 1990.*

Development and Validation of a Lead–Free Alloy for Solder Paste Applications by Laine–Ylijoki et al, IEEE Transactions on Components, Packaging, and Manufacturing Technology–Part C. vol. 20, No. 3, Jul. 1977.

* cited by examiner

Primary Examiner—Daniel J. Jenkins
(74) Attorney, Agent, or Firm—Michael Tobias

(57) ABSTRACT

A lead-free solder paste suitable for soldering chip parts includes a powder of a twin-peak Sn-based solder alloy containing 0.2–1.0 mass % of Ag and a flux. The solder alloy has a first peak of heat absorption in a differential scanning calorimeter curve at the start of melting and a second peak when the major portion of the alloy subsequently melts.

24 Claims, 6 Drawing Sheets

LEAD-FREE SOLDER PASTE

BACKGROUND OF THE INVENTION

1. Field of the Invention

This invention relates to a lead-free solder paste which is suitable for reflow soldering of chip components and which can prevent the occurrence of tombstoning during reflow soldering.

2. Description of the Related Art

Among soldering methods commonly in use today, the reflow soldering method is particularly suitable for bonding extremely small electronic components to printed circuit boards. In reflow soldering, a solder paste containing a fine solder powder and a flux is applied to selected areas of a printed circuit board by screen printing through a metal mask or silk screen. Electronic devices are then mounted on the applied solder paste and temporarily held in place on the printed circuit board by the stickiness of the solder paste. The printed circuit board and the electronic devices are then heated, usually in a furnace, to melt the solder powder in the paste. The molten paste is then cooled to solidify the molten solder, thereby forming soldered joints between the electronic devices and the circuit board.

The reflow soldering method enables minute electronic devices to be precisely positioned on a printed circuit board, and there is no undesired bridging of solder between adjoining electronic devices, so it can produce printed circuit boards of high accuracy and reliability. This method also has excellent productivity.

However, one problem which has been encountered when soldering minute electronic components to printed circuit boards by reflow soldering is the phenomenon of tombstoning (also referred to as the Manhattan phenomenon). In this phenomenon, one end of an electronic device becomes detached from a printed circuit board during reflow while its opposite end remains bonded to the circuit board, as a result of which the one end rises and the electronic device assumes a more or less vertical orientation. Tombstoning is caused by a difference in the time at which solder paste is melted at opposite ends of an electronic device during heating in a reflow furnace. The surface tension which molten solder exerts on an electronic component is greater than the adhesive force exerted by the tackiness of the solder in an unmelted state. Accordingly, if solder paste at a first end of an electronic device melts while the solder paste at a second end of the device is still unmelted, the surface tension exerted by the molten solder at the first end exerts a downward force on the first end which may be strong enough to detach the second end of the electronic device from the printed circuit board and cause the second end to swing upwards about the first end. When an electronic device undergoes tombstoning, the second end of the electronic device is not electrically connected to the printed circuit board, so the device cannot function properly. Tombstoning is particularly a problem with leadless chip components, which are extremely small and commonly have maximum dimensions less than a millimeter, making them very susceptible to tombstoning when there is an imbalance in the forces acting on their ends during reflow soldering.

It has been discovered that tombstoning can be prevented by the use of a twin-peak solder alloy, which is an alloy which has two peaks in a DSC (differential scanning calorimeter) curve between its solidus and liquidus temperatures, with some phase transformation occurring at the temperature of each peak. In contrast, a eutectic solder alloy has only a single peak in a DSC curve between its solidus and liquidus temperatures.

However, twin-peak solder alloys which have been proposed thus far for use in solder pastes are lead-containing solders. For example, U.S. Pat. No. 6,050,480 discloses twin-peak solder alloys containing up to nearly 40 mass % of lead.

In recent years, there has been a movement in the electronics industry away from the use of lead-containing solders due to the environmental damage which can occur when electronic equipment employing lead-containing solders is discarded in landfills and lead in the solder leaches into the water supply.

Accordingly, there is a great need by the electronics industry for a lead-free solder paste which is suitable for reflow soldering of electronic devices without the occurrence of tombstoning.

SUMMARY OF THE INVENTION

The present invention provides a lead-free solder paste which can be used for reflow soldering without causing tombstoning.

The present invention also provides a method of reflow soldering using a lead-free solder paste.

According to one form of the present invention, a solder paste comprises a mixture of a powder of a lead-free Sn-based solder alloy and a flux mixed with the powder. The solder alloy is a twin-peak solder having two peaks in a DSC curve between its solidus and liquidus temperatures and contains 0.2–1.0 mass % of Ag. The first peak occurs at the start of melting of the alloy, and the second peak occurs at a higher temperature than the first peak when the major portion of the solder alloy subsequently melts. Preferably the magnitude of the first peak is less than or equal to the magnitude of the second peak.

The solder alloy may include various additional components, such as a strength improving element, a melting point lower element, or an oxidation preventing element.

According to another form of the present invention, a soldering method comprises performing reflow soldering of electronic devices to a printed circuit board using a solder paste according to the present invention.

The present invention is not restricted to use with any one type of electronic device, but it is particularly suitable for the reflow soldering of leadless chip components.

DESCRIPTION OF PREFERRED EMBODIMENTS

Figure 1:
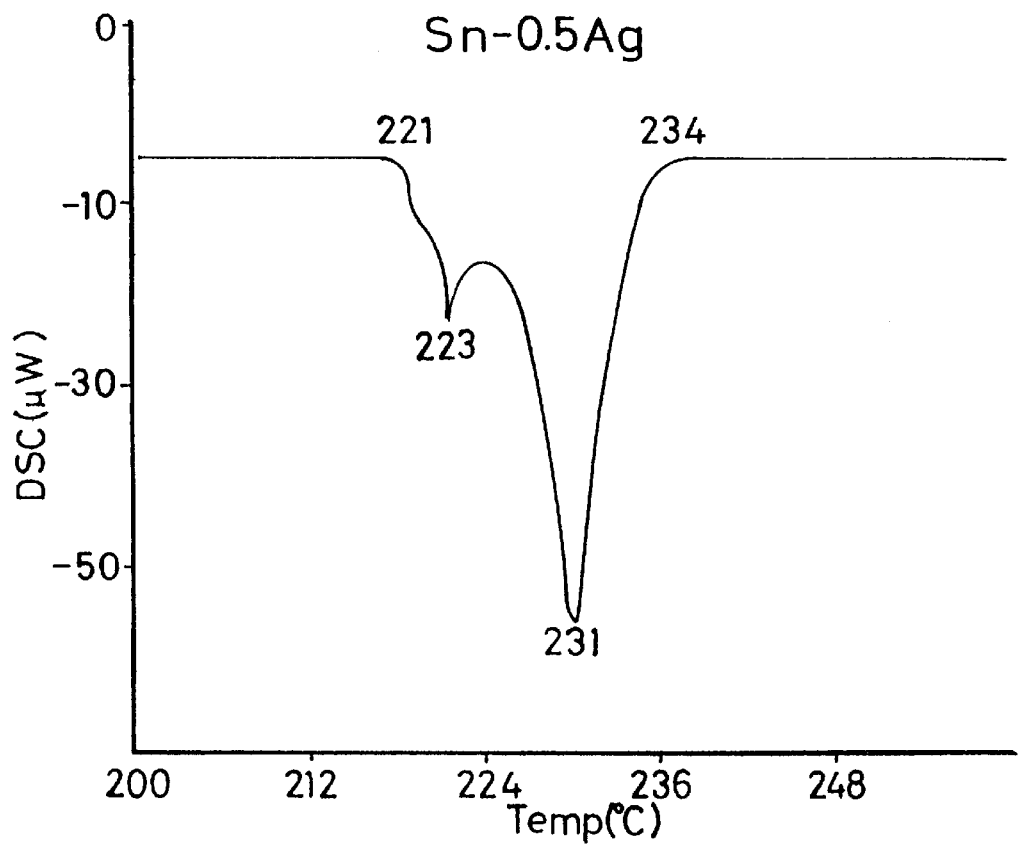
FIG. 1 is a DSC (differential scanning calorimeter) curve of a Sn-0.5Ag solder alloy.

A twin-peak solder alloy such as is used in a solder paste according to the present invention is thought to prevent tombstoning by undergoing gradual melting over a range of temperatures and thereby prolonging the time during which melting takes place. With a eutectic solder alloy, if solder begins melting at different times at opposite ends of an electronic device, the solder at one end of the electronic device may reach a completely melted state while the solder at the opposite end of the electronic device is still in an unmelted state. In this case, the solder in a completely melted state will exert a much greater tensile force on the electronic device than the unmelted solder, and the imbalance in tensile forces may cause tombstoning of the electronic device. With a twin-peak solder alloy, the forces acting on opposite ends of an electronic device during melting of the solder can be balanced so as to prevent tombstoning. If the solder at a first end of an electronic device begins to melt before the solder at the second end, since melting takes gradually, before the solder at the first end has completely melted, the solder at the second end begins to melt, so a state is achieved in which the solder at both ends is in a half-melted state. Namely, when the solder at the first end begins to melt, it exerts a weak surface tension in a half-melted state, but the surface tension in this state is not large enough to overcome the adhesive force acting on the second of the electronic device by the unmelted solder at the second end. When the solder at the second end begins to melt, it exerts a weak surface tension on the second end, which is stronger than the adhesive force which it exerted in an unmelted state. When the solder at the first end subsequently reaches a completely molten state, it exerts a stronger surface tension on the first end. However, the surface tension exerted by the half-melted solder at the second end is sufficiently great to resist the stronger surface tension exerted by the completely melted solder at the first end, so no tombstoning takes place.

Thus, a twin-peak solder can prevent tombstoning during reflow soldering by achieving a balance between the tensile forces acting on opposite ends of an electronic device. It is thought that tombstoning can be most effectively prevented when the ratio of the tensile forces acting on opposite ends of an electronic device during melting of solder is at most approximately 0.5.

If the solidification temperature range (the difference between the liquidus and solidus temperatures) for a twin-peak solder alloy is too small, tombstoning cannot be prevented, since the melting behavior of the solder alloy will resemble that of a eutectic solder alloy. On the other hand, if the solidification temperature range is very broad, a long time is required for melting, which may result in corrosion of electrodes or the growth of undesirable compounds in the regions being soldered, producing a decrease in the strength of the bonding interface. A large solidification range also prolongs the length of time required for solidification, increasing the chances of cracks being produced in soldered joints by vibrations or impacts applied to the joints during the process of solidification. Therefore, the solidification range of a twin-peak solder alloy used in a solder paste according to the present invention is preferably in the range of approximately 10 to 15° C.

Preferably the first peak of heat absorption in the DSC curve of a twin-peak solder alloy used in the present invention is less than or equal in magnitude to the second peak, since this is advantageous in causing the forces acting on an electronic device due to the surface tension of molten solder to gradually increase as melting proceeds. However, the desired effect cannot be obtained when the first peak is extremely small. Tombstoning can most effectively be prevented when the first and second peaks of heat absorption are approximately equal in magnitude.

The melting point of the Sn-based solder alloy may be 220° C. or above.

The Sn content of the solder alloy is not restricted but will typically be 90 mass % or above. The Ag content of the solder alloy is preferably 0.2–1.0 mass %. If the Ag content of the solder alloy is less than 0.2 mass %, the first peak of heat absorption becomes extremely small compared to the second peak. In this case, very little force due to surface tension acts on an electronic device at the temperature of the first peak, and the force due to surface tension suddenly increases at the second peak, so there is an inadequate balance between the forces acting on opposite ends of an electronic device, and tombstoning cannot be effectively prevented. On the other hand, if the solder alloy contains more than 1.0 mass % of Ag, the first peak of heat absorption in the DSC curve becomes significantly larger than the second peak, and the second peak substantially disappears. In this case as well, an imbalance develops between the forces due to surface tension action on opposite ends of an electronic device, and tombstoning cannot be effectively prevented.

The solder alloy may consist essentially of Sn and Ag, but it may also comprise a variety of additional element for providing the alloy with desired properties. For example, it may include one or more elements selected from strength improving elements to improve mechanical properties, melting temperature lowering elements to lower the melting temperature of the solder alloy to avoid thermal damage and deterioration in performance of electronic devices due to high temperatures, and oxidation preventing elements to prevent oxidation of the solder alloy during heating at the time of reflow soldering.

Examples of strength improving elements include Sb, Cu, Ni, Co, Fe, Mn, Cr, and Mo, one or more of which may be employed. Any one of these metals forms a solid solution or an intermetallic compound with Sn to improve mechanical strength. If the amount of these elements which is added is too large, the liquidus temperature of the solder alloy undesirably increases. Therefore, the total amount of Sb and Cu is preferably at most 1% of the total mass of the solder alloy, while the total amount of Ni, Co, Fe, Mn, Cr, and Mo is preferably at most 0.3% of the total mass of the solder alloy.

Examples of elements which are effective in lowering the reflow soldering temperature include one or more of Bi, In, and Zn. The total amount of these elements is preferably at least 0.5 mass % and at most 3 mass % of the total mass of the solder alloy.

Examples of oxidation preventing elements include one or more of P, Ga, and Ge. If too large a quantity of these elements is added, the liquidus temperature of the solder alloy undesirably increases, so the total amount of these elements is preferably at most 0.2 mass % of the total mass of the solder alloy.

A solder paste according to the present invention may be prepared by mixing the solder powder with a viscous flux in a conventional manner. Normally the solder powder will have a particle size between 100 and 400 mesh. Such a solder powder may be prepared by any appropriate technique, including inert gas (e.g., argon or nitrogen gas) atomization and centrifugal spraying, for example.

The viscous flux to be mixed with the solder powder may be either a non-water soluble flux or a water-soluble flux. A typical non-water soluble flux is a rosin-based flux, but other non-water soluble fluxes may be used. The rosin may be either polymerized or unpolymerized. The flux normally comprises a base material such as a rosin, a small amount of an activator, and optionally a thixotropic agent in a solvent. Examples of an activator for rosin include amine hydrohalide salts, amine organic acid salts, and organic acids.

Examples of a thixotropic agent include hydrogenated castor oil. Solvents useful for non-water soluble fluxes include glycol ethers, lower alcohols, and terpene.

The proportions of the solder powder and the flux are typically selected so as to give a mixture having a consistency suitable for printing. Generally, the weight ratio of the solder powder to the flux is in the range of from 80:20 to 95:5 and preferably from 85:15 to 92:8.

The solder paste can be applied to selected areas on a printed circuit board by screen printing or other convenient method. After electronic devices are mounted on the applied solder paste, the circuit board is heated in a reflow furnace to melt the solder alloy, thereby bonding the electronic devices to the circuit board.

Figure 3:
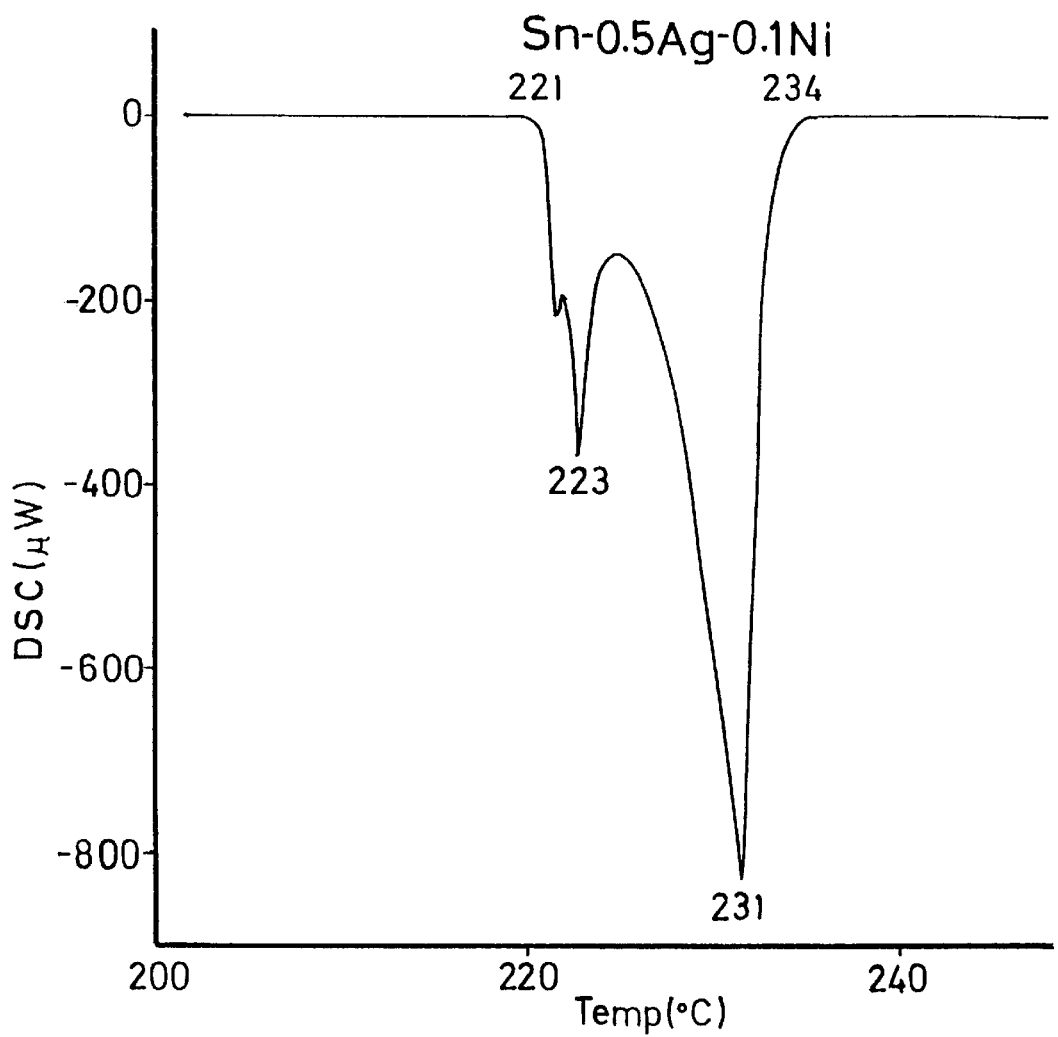
FIG. 3 is a DSC curve of a Sn-0.5Ag-0.1Ni solder alloy.
Figure 4:
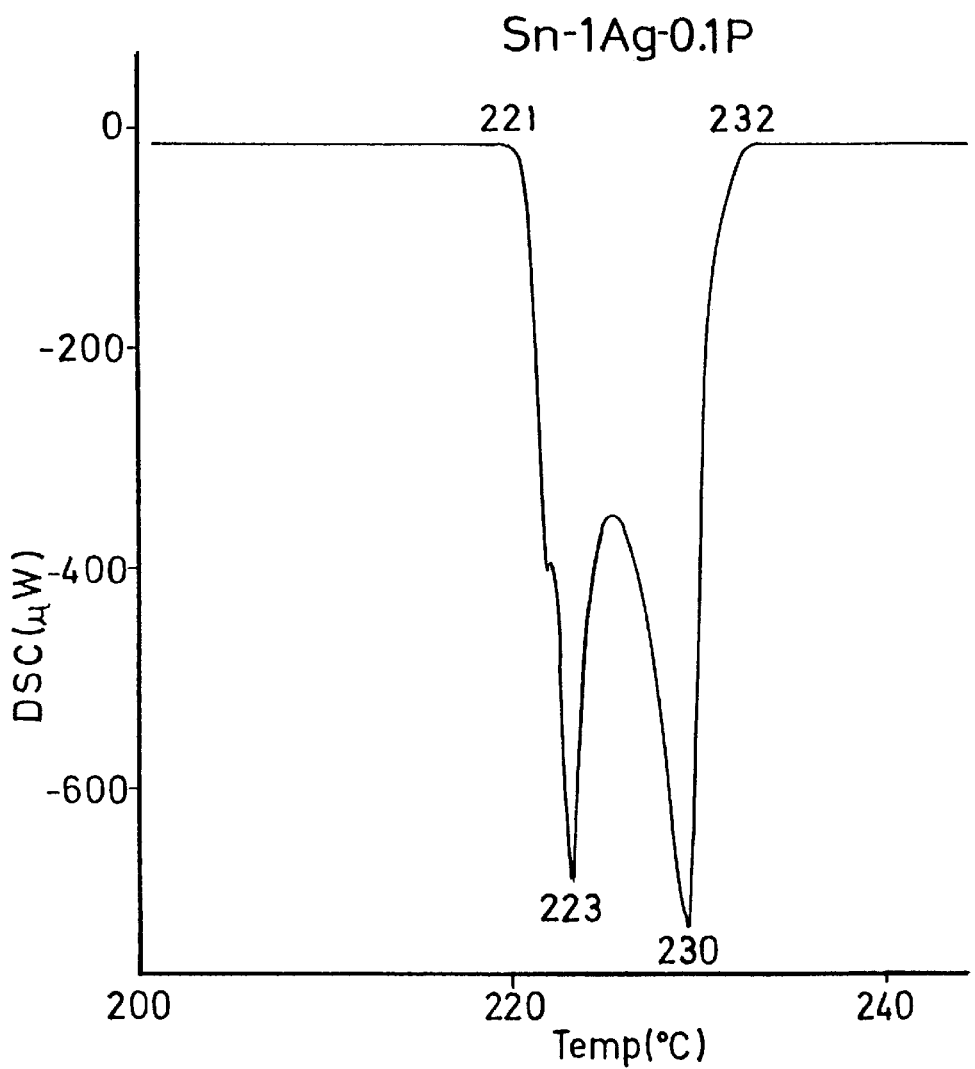
FIG. 4 is a DSC curve of a Sn-1Ag-0.1P solder alloy.
Figure 5:
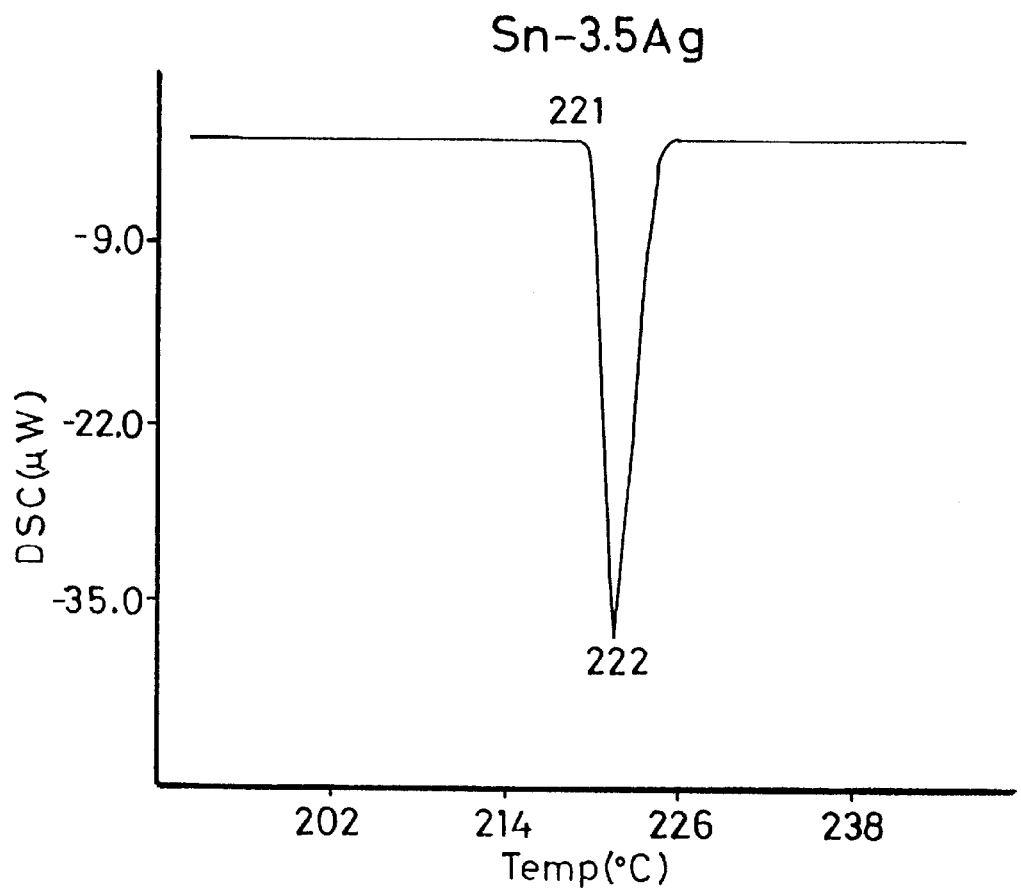
FIG. 5 is a DSC curve of a Sn-3.5Ag solder alloy.
Figure 6:
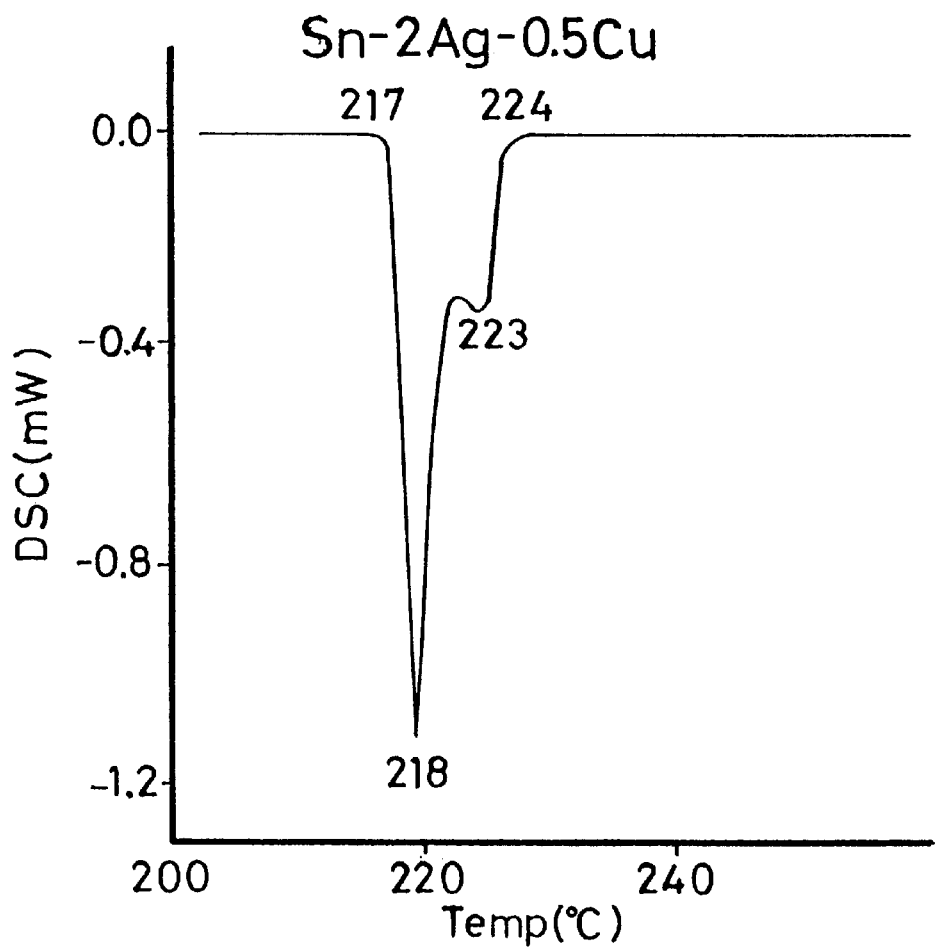
FIG. 6 is a DSC curve of a Sn-2Ag-0.5Cu solder alloy.

FIGS. 1–4 are DSC curves of lead-free solder alloys suitable for use in a solder paste according to the present invention, and FIGS. 5 and 6 are DSC curves of comparatives examples of lead-free solder alloys.

First, the lead-free solder alloys of FIG. 5 and FIG. 6 will be explained. FIG. 5 is a DSC curve of a eutectic Sn-3.5Ag solder alloy, and FIG. 6 is a DSC curve for a Sn-2Ag-0.5Cu solder alloy.

Since the Sn-3.5Ag solder alloy of FIG. 5 is a binary eutectic alloy, it has only a single large peak of heat absorption at 222° C., slightly above the eutectic temperature of 221° C. When reflow soldering is performed using this solder, the force due to surface tension acting on an end of an electronic device being soldered suddenly increases at the heat absorption peak of 222° C., and tombstoning can easily take place.

The Sn-2Ag-0.5Cu solder alloy of FIG. 6 begins to melt at 217° C., a first large peak of heat absorption appears immediately thereafter at 218° C., and the major portion of the solder alloy begins to melt. A second peak of heat absorption then appears at 223° C. and the remaining portion melts, and then the solder alloy entirely completes melting at 224° C., so it exhibits two peaks of heat absorption in its DSC curve. However, the first peak is much larger than the second peak, and the force due to surface tension suddenly increases at the first peak, so when this solder alloy is used for reflow soldering, an imbalance develops between the forces acting on opposite ends of an electronic device being soldered, and there is a significant likelihood of tombstoning taking place.

FIG. 1 is a DSC curve for a Sn-0.5Ag lead-free solder alloy. It begins melting at 221° C., a first large peak of heat absorption appears immediately thereafter at 223° C., a second peak of heat absorption which is larger then appears at 231° C., and melting is entirely completed at 234° C.

Figure 2:
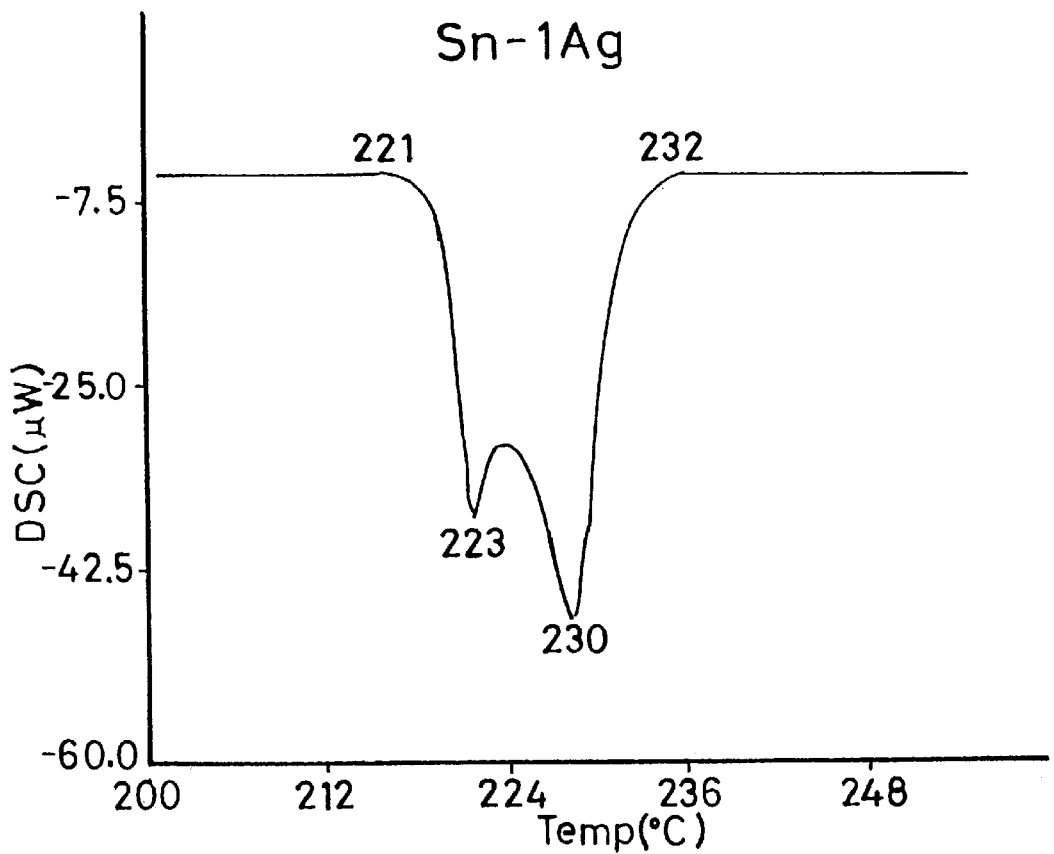
FIG. 2 is a DSC curve of a Sn-1Ag solder alloy.

FIG. 2 is a DSC curve for a Sn-1Ag lead-free solder alloy. It begins melting at 221° C., a first large peak of heat absorption appears immediately thereafter at 223° C., a second large peak of heat absorption then appears at 230° C., and melting is entirely completed at 232° C.

FIG. 3 is a DSC curve for a Sn-0.5Ag-0.1Ni lead-free solder alloy. It begins to melt at 221° C., a first large peak of heat absorption appears immediately thereafter at 223° C., a second peak of heat absorption which is larger than the first peak then appears at 231° C., and melting is entirely completed at 234° C.

FIG. 4 is a DSC curve for a Sn-1Ag-0.1P lead-free solder alloy. It begins to melt at 221° C., a first large peak of heat absorption appears immediately thereafter at 223° C., a second large peak of heat absorption then appears at 230° C., and melting is entirely completed at 232° C.

Each of the solder alloys of FIGS. 1–4 is a twin-peak alloy with two peaks of heat absorption in a DSC curve between its solidus and liquidus temperatures, with the first peak being less than or equal in magnitude than the second peak and occurring at the start of melting, and the major portion of melting occurs at the second peak. Therefore, each of these alloys exhibits a gradual melting pattern which can effectively prevent tombstoning.

EXAMPLES

The following examples illustrate the performance of a lead-free solder paste according to the present invention and of comparative examples of a lead-free solder paste when used in reflow soldering.

Example 1

In this example, powder of a high temperature solder alloy containing 0.5% Ag and a remainder of Sn (average particle diameter of 30 µm) was mixed with a conventional resin-type flux in the following proportions to obtain a solder paste.

| Lead-free solder alloy powder: Sn-0.5Ag | 90 mass % |
|---|---|
| Paste-type flux: | 10 mass % |

FIG. 1 is a DSC curve of the solder alloy of this example.

Example 2

A solder paste having the composition described below was obtained in the same manner as in Example 1.

| Lead-free solder alloy powder: Sn-1Ag-0.1Ni | 90 mass % |
|---|---|
| Paste-type flux: | 10 mass % |

Comparative Example 1

In this example, the procedure of Example 1 was repeated to obtain a solder paste having the following composition.

| Lead-free solder alloy powder: Sn-3.5Ag | 90 mass % |
|---|---|
| Paste-type flux: | 10 mass % |

FIG. 5 is a DSC curve for the solder alloy of this example.

Comparative Example 2

In the same manner as in Comparative Example 1, a solder paste having the following composition was obtained.

| Lead-free solder alloy powder: Sn-2Ag-0.5Cu | 90 mass % |
|---|---|
| Paste-type flux: | 10 mass % |

FIG. 6 is a DSC curve for the solder alloy of this example.

A tombstoning test was carried out using the solder pastes of the above-described examples of the present invention and comparative examples. In the tombstoning test, solder was applied by printing using a mask on a printed circuit board, and then 1600 type-1005 chip components (having rectangular dimension of 1 mm in length and 0.5 mm in width) were mounted on the regions of the printed circuit board where the solder paste had been applied. The printed circuit board and the chip components were heated in a reflow furnace to melt the solder paste and solder the chip components to the printed circuit board. After soldering, the number of chip components which had undergone tombstoning was counted.

There was no tombstoning of any of the chip components soldered using the solder pastes of Example 1 and Example 2 according to the present invention. In contrast, 13 chip components underwent tombstoning for Comparative Example 1, and 6 chip components underwent tombstoning for Comparative Example 2, illustrating the high reliability of a lead-free solder paste according to the present invention compared to conventional lead-free solder pastes.

What is claimed is:

1. A soldering method comprising performing reflow soldering of leadless chip components on a printed circuit board using a lead-free solder paste which comprises a lead-free solder alloy powder mixed with a flux, the solder alloy powder having a twin-peak alloy composition including 0.2–1.0 mass % of Ag and at least 90 mass % of Sn and having a first peak of heat absorption in a differential scanning calorimeter curve at the start of melting of the solder alloy and a second peak when the major portion of the solder alloy subsequently melts.

2. A method as claimed in claim 1 wherein the solder alloy has a melting point of at least 220° C.

3. A method as claimed in claim 1 wherein the solder alloy further includes a strength improving element.

4. A method as claimed in claim 3 wherein the strength improving element comprises at least one of Sb and Cu in a total amount of at most 1.0 mass % of the solder alloy.

5. A method as claimed in claim 3 wherein the strength improving element comprises at least one element selected from the group consisting of Ni, Co, Fe, Mn, Cr, and Mo in a total amount of at most 0.3 mass % of the solder alloy.

6. A method as claimed in claim 1 wherein the solder alloy further includes a melting point lowering element.

7. A method as claimed in claim 6 wherein the melting point lowering element comprises at least one element selected from the group consisting of Bi, In, and Zn in a total amount of at least 0.5 mass % and at most 3.0 mass % of the solder alloy.

8. A method as claimed in claim 1 wherein the solder alloy further includes an oxidation preventing element.

9. A method as claimed in claim 8 wherein the oxidation preventing element comprises at least one element selected from the group consisting of P, Ga, and Ge in a total amount of at most 0.2 mass % of the solder alloy.

10. A soldering method comprising soldering of chip components to a substrate using a lead-free solder paste which comprises a lead-free Sn-based solder alloy powder mixed with a flux, the solder alloy powder having a twin-peak alloy composition including 0.2–1.0 mass % of Ag and having a first peak of heat absorption in a differential scanning calorimeter curve at the start of melting of the solder alloy and a second peak when the major portion of the solder alloy subsequently melts.

11. A method as claimed in claim 10 wherein the solder alloy has a melting point of at least 220° C.

12. A method as claimed in claim 10 wherein the solder alloy further includes a strength improving element.

13. A method as claimed in claim 12 wherein the strength improving element comprises at least one of Sb and Cu in a total amount of at most 1.0 mass % of the solder alloy.

14. A method as claimed in claim 12 wherein the strength improving element comprises at least one element selected from the group consisting of Ni, Co, Fe, Mn, Cr, and Mo in a total amount of at most 0.3 mass % of the solder alloy.

15. A method as claimed in claim 10 wherein the solder alloy further includes a melting point lowering element.

16. A method as claimed in claim 15 wherein the melting point lowering element comprises at least one element selected from the group consisting of Bi, In, and Zn in a total amount of at least 0.5 mass % and at most 3.0 mass % of the solder alloy.

17. A method as claimed in claim 10 wherein the solder alloy further includes an oxidation preventing element.

18. A method as claimed in claim 17 wherein the oxidation preventing element comprises at least one element selected from the group consisting of P, Ga, and Ge in a total amount of at most 0.2 mass % of the solder alloy.

19. A method as claimed in claim 1 wherein the solder alloy consists essentially of Sn and Ag.

20. A method as claimed in claim 1 wherein the solder alloy consists essentially of Sn, Ag, and Ni.

21. A method as claimed in claim 1 wherein the solder alloy consists essentially of Sn, Ag, and P.

22. A method as claimed in claim 10 wherein the solder alloy consists essentially of Sn and Ag.

23. A method as claimed in claim 10 wherein the solder alloy consists essentially of Sn, Ag, and Ni.

24. A method as claimed in claim 10 wherein the solder alloy consists essentially of Sn, Ag, and P.

* * * * *